(12) United States Patent
Liu et al.

(10) Patent No.: US 6,531,361 B1
(45) Date of Patent: Mar. 11, 2003

(54) FABRICATION METHOD FOR A MEMORY DEVICE

(75) Inventors: Mu-Yi Liu, Taichung (TW); Kwang-Yang Chan, Hsinchu (TW); Yen-Hung Yeh, Taoyuan Hsien (TW); Tso-Hung Fan, Taipei Hsien (TW); Tao-Cheng Lu, Kaoshiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/142,720

(22) Filed: May 8, 2002

(30) Foreign Application Priority Data

Apr. 25, 2002 (TW) .................................. 91108517 A

(51) Int. Cl.⁷ ............................................ H01L 21/336
(52) U.S. Cl. .......................... 438/257; 438/211
(58) Field of Search ................... 438/211, 218, 438/226, 257, 370, 942, 267, 282, 308

(56) References Cited

U.S. PATENT DOCUMENTS 6,232,181 B1 * 5/2001 Lee

\* cited by examiner

*Primary Examiner*—David Nelms
*Assistant Examiner*—Phuc T. Dang
(74) *Attorney, Agent, or Firm*—J.C. Patents

(57) ABSTRACT

A fabrication method for a memory device is described. The method includes sequentially forming a pad oxide layer and a mask layer on a substrate, wherein the mask layer exposes a portion of the pad oxide layer. Thereafter, an ion implantation process is conducted to form a buried bit line in the substrate that is not covered by the mask layer. A raised bit line is then formed on the pad oxide layer above the buried bit line. The mask layer and the pad oxide layer are then removed, followed by forming a conformal gate oxide layer on the surface of the substrate and the raised bit line. A word line is further formed on the gate oxide layer.

16 Claims, 4 Drawing Sheets

FABRICATION METHOD FOR A MEMORY DEVICE

CROSS-REFERENCE TO RELATED APPLICATION

This application claims the priority benefit of Taiwan application serial no. 91108517, filed Apr. 25, 2002.

BACKGROUND OF THE INVENTION

1. Field of the Invention present invention relates to a fabrication method for a memory device. More particularly, the present invention relates to a method that uses a raised bit line to improve the memory characteristic of a memory device.

2. Description of Related Art

A memory device, apparently, is a semiconductor device used in storing information or data. For the storage of digital information, memory capacity is normally described in terms of "bit". Each unit in a memory device for storing information is known as a "cell". The exact location of each memory cell in millions of memory cells is known as the "address". The memory cells in a memory device are arranged in an array, where each row along with each column constitutes a specific memory address. Memory cells of a same row or of a same column are connected together by a common conductive line.

As shown in FIG. 1, FIG. 1 illustrates a cross-sectional view of a conventional memory device.

Referring to FIG. 1, according to the conventional fabrication method for a memory device, a gate structure 108 is formed on a substrate 100, wherein the gate structure includes a gate conductive layer 104 and a gate oxide layer 102. A buried bit line 112 is then formed in the substrate 100 beside the gate structure 108. Thereafter, an insulation layer 116 is formed on the substrate 100 above the buried bit line 112. The insulation layer 116 is used to isolate the gate structures 108. A word line 118 is further formed on the substrate 100 to electrically connect a row of gate structures 108.

As memory devices continue to reduce in size along with the increase in the integration of integrated circuits, the dimension of the buried bit line needs to be reduced correspondingly. Consequently, the current flow in a memory cell becomes small and the bit line becomes overloaded. If by increasing the junction depth of the bit line to resolve the problem of the increase of the bit line resistance, not only short channel effect may develop, the problem of punch-through leakage may result. If a high dopant concentration is used to form a shallow junction bit line in order to prevent the short channel effect and the punch-through leakage problem due to a deep junction depth, the problem of overloading the bit line remains unresolved due to the limitation of solid phase solubility.

SUMMARY OF THE INVENTION

Accordingly, the present invention provides a fabrication method for a memory device in which the resistance of the bit line is lower.

The present invention also provides a fabrication method for a memory device, wherein the buried bit line can have a shallow junction to prevent the problems of short channel effect and punch-through leakage.

The present invention further provides a fabrication method for a memory device. The method comprises forming a pad oxide layer on a substrate. A silicon nitride mask layer is further formed on the pad oxide layer, wherein the silicon nitride mask layer exposes a portion of the pad oxide layer. Thereafter, an ion implantation process is performed to form a buried bit line in the part of the substrate not covered by silicon nitride mask layer. The present invention further comprises forming a pocket doped region beside the side of the buried bit line. A raised bit line is then formed on the pad oxide layer that is above the buried bit line. Forming the raised bit line includes using the pad oxide layer as a seed layer and then forming a selective epitaxy layer as the raised bit line on the exposed pad oxide layer. Thereafter, the mask layer and the pad oxide layer are removed. A conformal oxide layer is then formed on the substrate and on the raised bit line, followed by forming a word line on the gate oxide layer.

Since the bit line of the memory device of the present invention is formed by the buried bit line and the raised bit line, the resistance of the bit line is effectively reduced to prevent overloading the bit line.

Further, the memory device formed according to the present invention includes a raised bit line. The junction of the buried bit line can be shallow to prevent the short channel effect and the problem of punch-through leakage.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
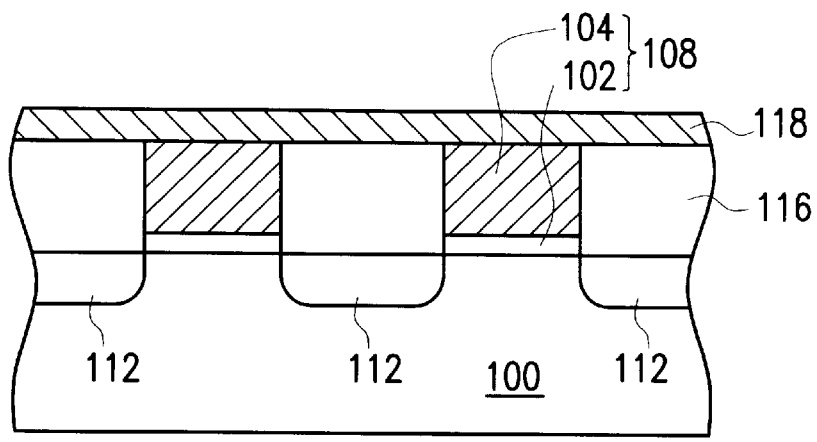
FIG. 1 is a schematic, cross-sectional view illustrating the structure of a conventional flash memory device.
Figure 2:
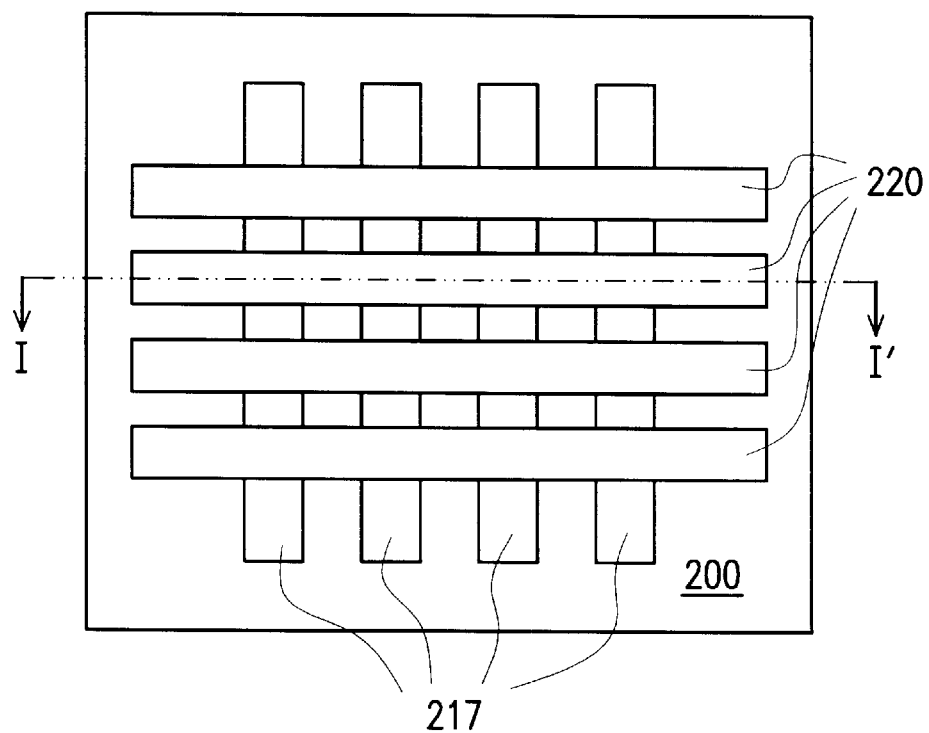
FIG. 2 is a top view of a memory device formed according to one preferred embodiment of the present invention.

FIG. 2 is a top view of a memory device according to one preferred embodiment of the present invention; while FIGS. 3A to 3F are schematic, cross-sectional view along the I–I' in FIG. 2, illustrating the fabrication method of the memory device according to the one preferred embodiment of the present invention.

Figure 3A:
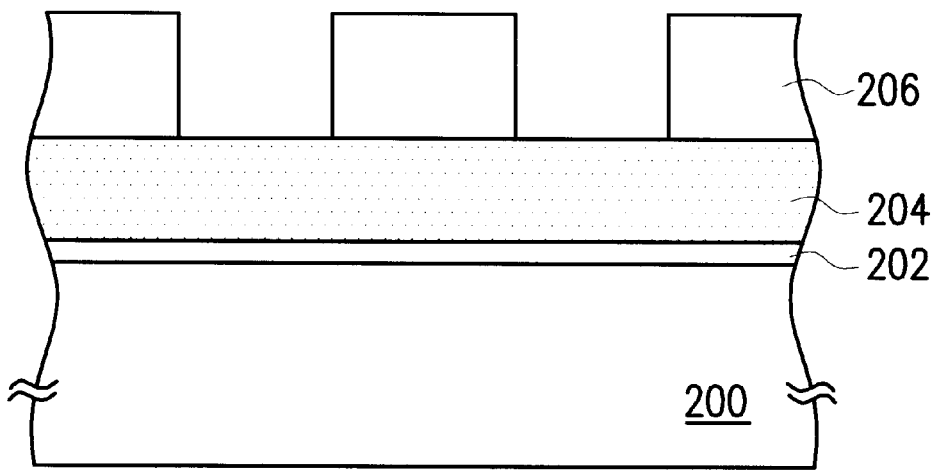
FIGS. 3A to 3F are schematic, cross-sectional view along the I–I' in FIG. 2, illustrating the fabrication method of the memory device according to the one preferred embodiment of the present invention.

Referring to FIG. 2 and FIG. 3A, a pad oxide layer 202 is formed on a substrate 200, wherein the pad oxide layer 202 is about 100 angstroms to 300 angstroms thick, and is preferably about 200 angstroms thick. A silicon nitride layer 204 is then formed on the pad oxide layer 202, wherein the silicon nitride layer 204 is about 400 angstroms to 600 angstroms thick, and is preferably about 500 angstroms thick. Thereafter, a patterned photoresist layer 206 is formed on the silicon nitride layer 204, exposing the part of the silicon nitride layer 204 where the buried bit line is going to be formed thereunder.

Figure 3B:
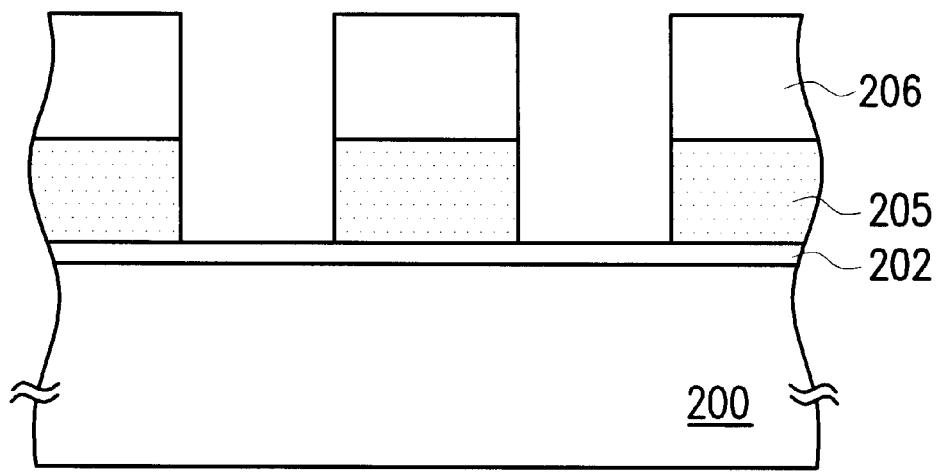

Referring to FIG. 3B, using the photoresist layer 206 as an etching mask, the silicon nitride layer 204 is then patterned to form a silicon nitride mask layer 205, exposing a part of the pad oxide layer 202.

Figure 3C:
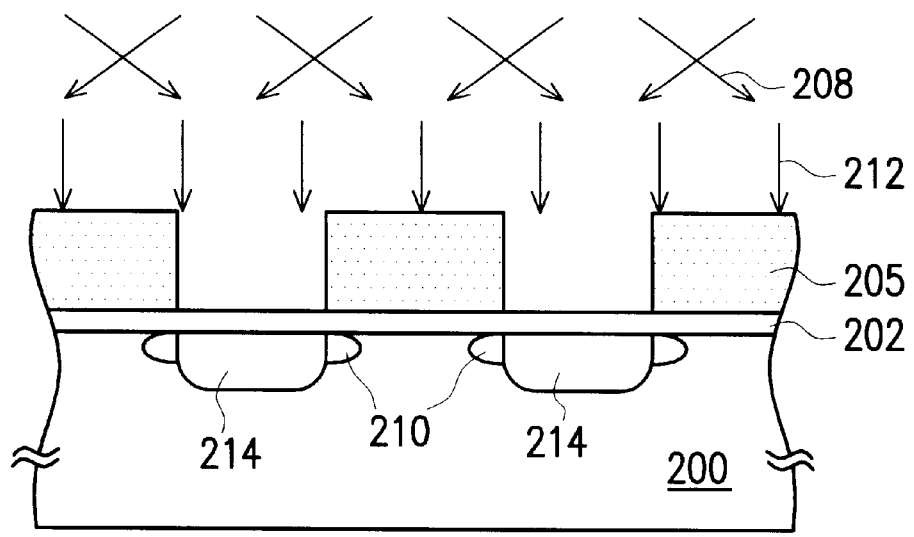

As shown in FIG. 3C, using the silicon nitride mask layer 205 as an ion implantation mask, a pocket ion implantation process 208 and an ion implantation process 212 are conducted to form a pocket doped region 210 in the substrate 200 and a buried bit line 214, respectively. The buried bit line 214 is a shallow junction buried bit line.

The implantation energy for the pocket ion implantation process 208 is about 40 keV. The dopant concentration of the pocket ion implantation process 208 is about $4\times10^{13}/cm^2$ and the implantation angle is about 45 degrees.

The implantation energy for the ion implantation process 212 is about 2 keV. The dopant concentration of the ion implantation process 212 is about $1.5\times10^{15}/cm^2$.

Figure 3D:
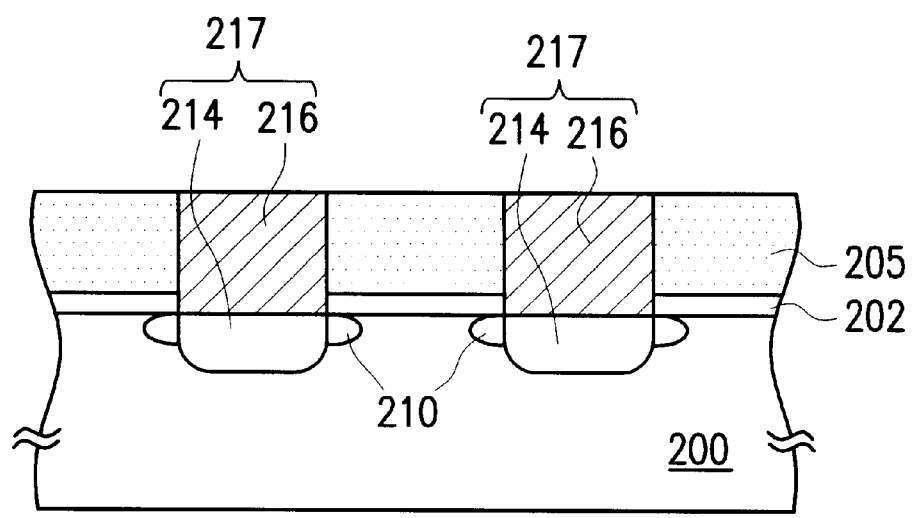

Continuing to FIG. 3D, a selective epitaxy layer 216 is then formed on the exposed pad oxide layer 202, wherein the selective epitaxy layer 216 is formed using the pad oxide layer 202 as a seed layer. The selective epitaxy layer 216 serves as a raised bit line. In other words, the bit line 217 of the memory device of the present invention is formed with the buried bit line 214 and the raised bit line 216.

Figure 3E:
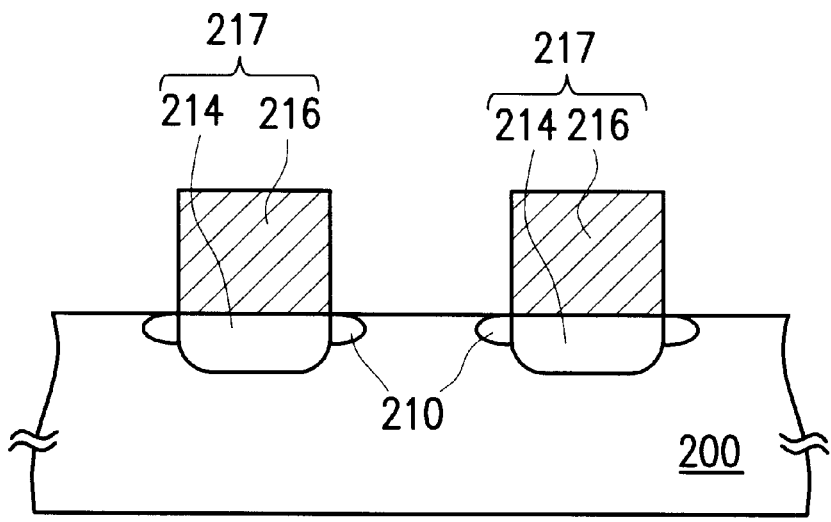

Referring to FIG. 3E, the silicon nitride mask layer 205 and the pad oxide layer 202 are removed.

Figure 3F:
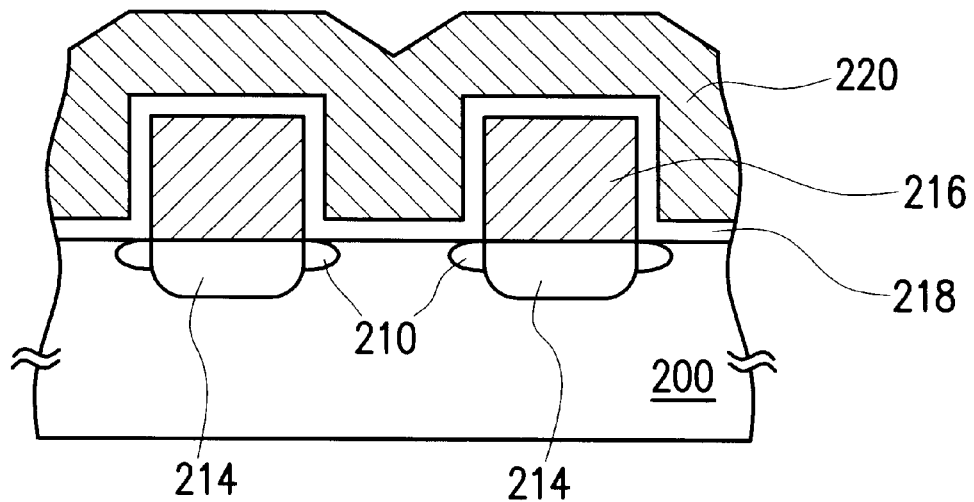

As shown in FIG. 3F, a conformal gate oxide layer 218 is formed on the substrate 200 and the selective epitaxy layer 216. A word line 220 is further formed on the gate oxide layer 218, wherein the word line 220 is formed with a material that includes polysilicon. The fabrication of a memory device of the present invention is thereby completed.

According to the memory device of the present invention, the bit line 217 is formed with the buried bit line 214 and the raised bit line 216. Therefore, even though the dimension of the buried bit line 214 continues to reduce due to a reduction of a device dimension, the problem of increasing the bit line resistance is resolved due to the formation of the raised bit line 216. Since the formation of the raised bit line 216 can resolve the problem of an increased bit line resistance, the short channel effect and the punch-through leakage problem can be prevented.

According to the fabrication method of a memory device, the bit line resistance can be effectively reduced to prevent overloading the bit line.

Further, the buried bit line of the memory device formed according to the present invention can be shallow. The development of the short channel effect and the punch-through leakage problem are obviated.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a memory device, the method comprising:

forming a pad oxide layer on the substrate;

forming a mask layer on the pad oxide layer, exposing a portion of the pad oxide layer;

performing an ion implantation process to form a buried bit line in the substrate that is not covered by the mask layer;

forming a raised bit line above the buried bit line;

removing the mask layer and the pad oxide layer;

forming a conformal gate oxide layer on a surface of the raised bit line and on the substrate; and forming a word line on the gate oxide layer.

2. The method of claim 1, wherein the raised bit line includes a selective epitaxy layer.

3. The method of claim 2, wherein forming the selective epitaxy layer includes using the pad oxide layer as a seed layer.

4. The method of claim 1, wherein an implantation energy for the ion implantation process is about 2 keV and a dopant concentration is about $1.5\times10^{15}/cm^2$.

5. The method of claim 1, wherein the buried bit line is a shallow junction bit line.

6. The method of claim 1, the method further comprising performing a pocket ion implantation process to form a pocket doped region beside the buried bit line.

7. The method of claim 6, wherein an implantation energy for the pocket ion implantation process is about 40 keV, a dopant concentration for the pocket implantation process is about $4\times10^{13}/cm^2$ and an implantation angle is about 45 degrees.

8. The method of claim 1, wherein a material for the mask layer includes silicon nitride.

9. The method of claim 1, wherein the mask layer is about 400 angstroms to about 600 angstroms thick.

10. The method of claim 1, wherein the pad oxide layer is about 100 angstroms to about 300 angstroms thick.

11. The method of claim 1, wherein a material for the word line includes polysilicon.

12. A fabrication method for a raised bit line of a memory device, comprising:

forming a seed layer on a substrate;

forming a mask layer on the seed layer, the mask layer exposes a portion of the seed layer;

forming a selective epitaxy layer as a raised bit line on the exposed seed layer; and removing the mask layer and the seed layer.

13. The method of claim 12, wherein the mask layer includes a silicon nitride layer.

14. The method of claim 12, wherein the mask layer is about 400 angstroms to about 600 angstroms thick.

15. The method of claim 12, wherein the seed layer includes a pad oxide layer.

16. The method of claim 12, wherein the seed layer is about 100 angstroms to about 300 angstroms thick.

* * * * *